United States Patent
Westerlaken et al.

(10) Patent No.: US 9,885,964 B2
(45) Date of Patent: Feb. 6, 2018

(54) LITHOGRAPHIC APPARATUS AND DEVICE MANUFACTURING METHOD

(71) Applicants: Jan Steven Christiaan Westerlaken, Heesch (NL); Rob Jansen, Veldhoven (NL); Erik Vervoort, Sint-Oedenrode (NL)

(72) Inventors: Jan Steven Christiaan Westerlaken, Heesch (NL); Rob Jansen, Veldhoven (NL); Erik Vervoort, Sint-Oedenrode (NL)

(73) Assignee: ASML NETHERLANDS B.V., Veldhoven (NL)

(*) Notice: Subject to any disclaimer, the term of this patent is extended or adjusted under 35 U.S.C. 154(b) by 1207 days.

(21) Appl. No.: 13/659,729

(22) Filed: Oct. 24, 2012

(65) Prior Publication Data

US 2013/0107236 A1 May 2, 2013

Related U.S. Application Data

(60) Provisional application No. 61/552,282, filed on Oct. 27, 2011.

(51) Int. Cl.
  *G03B 27/52* (2006.01)
  *G03B 27/58* (2006.01)
  *G03F 7/20* (2006.01)

(52) U.S. Cl.
  CPC ........ *G03F 7/7075* (2013.01); *G03F 7/70875* (2013.01)

(58) Field of Classification Search
  CPC ......... G03B 27/52; G03F 7/20; G03F 7/7075; G03F 7/70875; G03F 7/70991;
  (Continued)

(56) References Cited

U.S. PATENT DOCUMENTS 5,329,126 A    7/1994  Amemiya et al.
6,342,941 B1 * 1/2002  Nei et al. ................... 355/52
(Continued)

FOREIGN PATENT DOCUMENTS

CN    101436564    5/2009
CN    101727016    6/2010
(Continued)

OTHER PUBLICATIONS

Chinese Office Action dated Apr. 22, 2014 in corresponding Chinese Patent Application No. 201210413077.2.
(Continued)

*Primary Examiner* — Colin Kreutzer
(74) *Attorney, Agent, or Firm* — Pillsbury Winthrop Shaw Pittman LLP

(57) ABSTRACT

A lithographic apparatus includes a substrate table constructed to hold a substrate; a compartment configured to receive the substrate table; a thermal conditioning unit arranged to receive a substrate to be exposed and thermally condition the substrate; and a transfer system for transferring a thermally conditioned substrate to the substrate table, wherein the substrate table and the thermal conditioning unit are arranged inside the compartment of the lithographic apparatus, at least during a transfer of the thermally conditioned substrate from the thermal conditioning unit to the substrate table.

16 Claims, 4 Drawing Sheets

(58) Field of Classification Search
CPC .... G03F 9/7011; H01L 21/027; H01L 21/677; H01L 21/67703; H01L 21/67098–21/67115; H01L 21/67739; H01L 21/67748; H01L 21/683; H01L 21/68707

USPC .......... 355/27, 30, 72; 414/936, 941; 901/40
See application file for complete search history.

(56) References Cited

U.S. PATENT DOCUMENTS

| | | | |
|---|---|---|---|
| 6,483,569 | B2 | 11/2002 | Ota |
| 7,106,420 | B2 | 9/2006 | Kuit et al. |
| 2002/0011207 | A1 | 1/2002 | Uzawa et al. |
| 2006/0033893 | A1* | 2/2006 | Nakano ............................ 355/30 |
| 2007/0070324 | A1 | 3/2007 | Kuit et al. |
| 2007/0151515 | A1* | 7/2007 | Kim ................................. 118/719 |
| 2008/0013089 | A1* | 1/2008 | Ishii et al. ...................... 356/400 |
| 2009/0207392 | A1 | 8/2009 | Rijpma et al. |
| 2010/0297562 | A1* | 11/2010 | Shibazaki ....................... 430/325 |
| 2013/0177857 | A1* | 7/2013 | Shibazaki ....................... 430/325 |
| 2013/0183623 | A1* | 7/2013 | Shibazaki ....................... 430/296 |

FOREIGN PATENT DOCUMENTS

| | | | |
|---|---|---|---|
| JP | H11-284052 | | 10/1999 |
| JP | 2000-068176 | | 3/2000 |
| JP | 2000-077314 | | 3/2000 |
| JP | 2001-085323 | | 3/2001 |
| JP | 2001-110722 | | 4/2001 |
| JP | 2001-110872 | | 4/2001 |
| JP | 2002-057092 | | 2/2002 |
| JP | 2002-057100 | | 2/2002 |
| JP | 2002-280287 | | 9/2002 |
| JP | 2003-142386 | | 5/2003 |
| JP | 2005-044882 | | 2/2005 |
| JP | 2005311113 A | * | 11/2005 ............. H01L 21/68 |
| JP | 2005-333116 | | 12/2005 |
| JP | 2006-024715 | | 1/2006 |
| JP | 2006-078029 | | 3/2006 |
| JP | 2006-294860 | | 10/2006 |
| JP | 2008-300770 | | 12/2008 |
| JP | 2009-076587 | | 4/2009 |
| JP | 2009-252981 | | 10/2009 |
| JP | 2010-073963 | | 4/2010 |
| JP | 2012-114219 | | 6/2012 |
| WO | 2006/025386 | | 3/2006 |
| WO | 2011/065380 | | 6/2011 |

OTHER PUBLICATIONS

Japanese Office Action dated Feb. 26, 2015 in corresponding Japanese Patent Application No. 2012-232302.
Chinese Office Action dated Jul. 6, 2015 in corresponding Chinese Patent Application No. 201210413077.2.
Japanese Office Action dated Mar. 24, 2016 in corresponding Japanese Patent Application No. 2012-232302.

* cited by examiner

PRIOR ART

LITHOGRAPHIC APPARATUS AND DEVICE MANUFACTURING METHOD

CROSS REFERENCE TO RELATED APPLICATIONS

This application claims priority and benefit under 35 U.S.C. §119(e) to U.S. Provisional Patent Application Ser. No. 61/552,282, entitled "Lithographic Apparatus and Device Manufacturing Method," filed on Oct. 27, 2011, the content of which is incorporated herein in its entirety by reference.

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate. In general, integrated circuits (ICs) comprise a plurality of successive layers that are generated by applying different patterns. In between the application of two successive layers using a lithographic apparatus, a substrate is often processed outside the lithographic apparatus, e.g. in a so-called track apparatus, wherein the wafers undergo various thermal and other treatments. Once a wafer has been processed, it has to be conditioned (in particularly thermally conditioned) before a next exposure process can be applied. In order to ensure that the pattern as applied in a next exposure is applied on the appropriate position relative to an earlier layer, stringent requirements with respect to temperature offset and uniformity have to be met.

In conventional apparatuses, handling robots are applied to transport wafers to be processed and processed wafers to and from a lithographic apparatus. Such handling robots are often equipped with a further functionality such as a thermal conditioning of the wafers that are e.g. received from a track apparatus, prior to transferring these wafers to a lithographic apparatus.

It has been observed that the thermal conditioning of wafers in such conventional handling robots is however insufficient to accommodate for ever increasing requirement such as overlay. In particular with respect to the processing of large wafers such as 450 mm wafers, it is expected that current thermal conditioning of wafers is insufficient to meet future demands with respect to temperature offset and temperature uniformity.

SUMMARY

It is desirable to improve or facilitate the thermal conditioning of wafers prior to being exposed in a lithographic apparatus.

According to an embodiment of the invention, there is provided a lithographic apparatus comprising a substrate table constructed to hold a substrate; a compartment for locating the substrate table; a thermal conditioning unit arranged to receive a substrate to be exposed; thermally condition the substrate; and a transfer system to transfer a thermally conditioned substrate to the substrate table, wherein the substrate table and the thermal conditioning unit are arranged inside the compartment of the lithographic apparatus during a transfer of the thermally conditioned substrate from the thermal conditioning unit to the substrate table.

According to an embodiment of the invention, there is provided a device manufacturing method comprising: providing a lithographic apparatus comprising a thermal conditioning unit; receiving a substrate to be exposed by the thermal conditioning unit; thermally conditioning the substrate; transferring the thermally conditioned substrate to a substrate table provided in a compartment of the lithographic apparatus; the substrate table and the thermal conditioning unit being arranged inside the compartment of the apparatus during the transfer; projecting a patterned beam of radiation onto the substrate.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
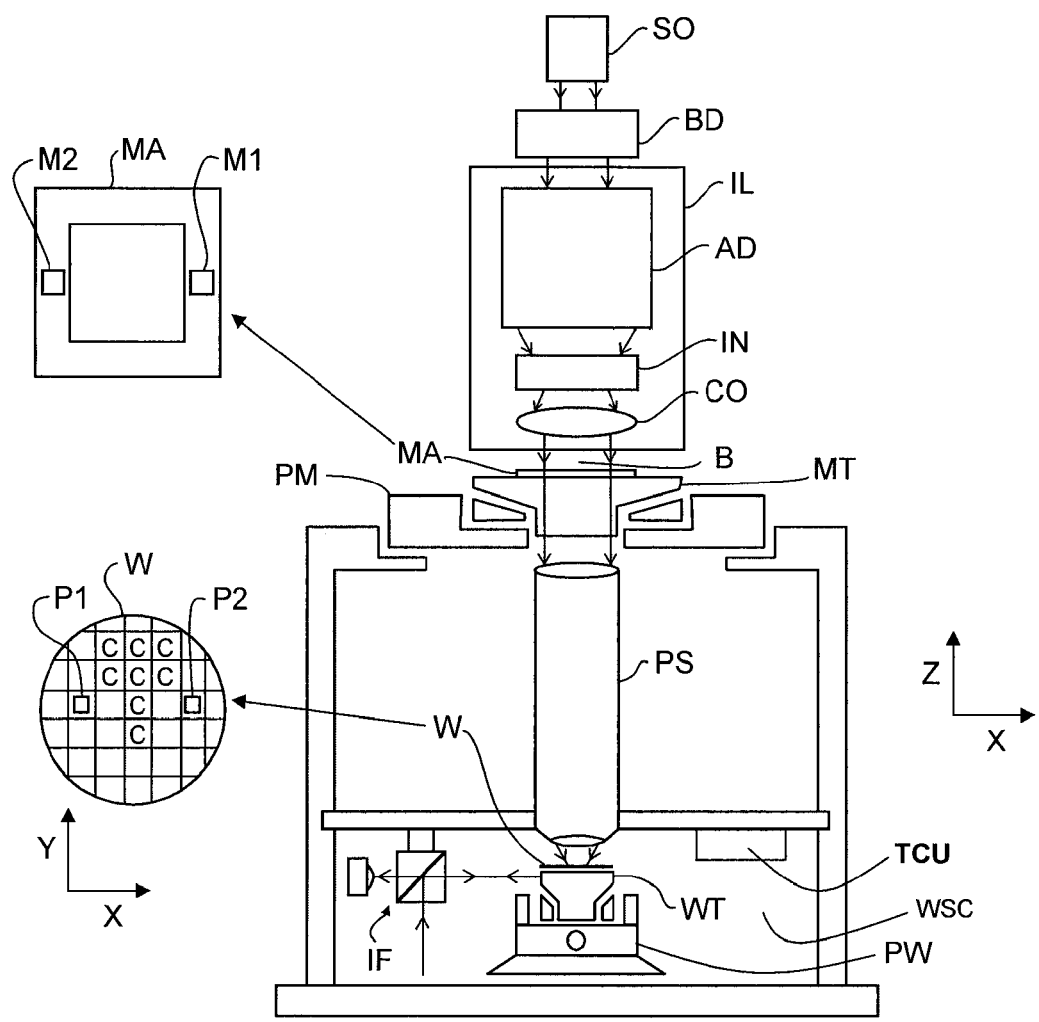
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the support structure (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW.

In the case of a stepper (as opposed to a scanner) the support structure (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the patterning device alignment marks may be located between the dies.

In accordance with an embodiment of the present invention, the lithographic apparatus as shown in FIG. 1 further comprises a thermal conditioning unit (TCU), which is, in the embodiment as shown, mounted near the substrate stage. In the arrangement as shown, the TCU is, in such a position that the substrate stage can be positioned below the thermal conditioning unit TCU, in order to receive thermally conditioned substrates, prior to being exposed by the patterned radiation beam. By arranging the thermal conditioning unit near the substrate stage, i.e. in the same compartment of the apparatus where the substrate stage is located, the required thermal condition of the substrate (with respect to temperature offset and uniformity) is more easily maintained. It has been observed that when the thermal conditioning of a substrate to be exposed is done more remote, e.g. in an interface module such as a substrate handler interfacing between a track and a lithographic apparatus, the desired constraints with respect to temperature offset and uniformity are difficult to maintain. In order to transfer the thermally conditioned wafer (by the TCU) to the substrate table, a transfer system is applied in an embodiment of the present invention. Various embodiments of such transfer system are described in more detail below. In an embodiment, the transfer system comprises a gripper configured to displace the thermally conditioned substrate from the thermal conditioning unit to the substrate table. However, this is not limiting. It is envisioned to use other variations of the transfer system in other embodiments of the invention.

A temperature offset or non-uniformity may result in errors such as overlay errors during the manufacturing process of the integrated circuit. Due to the ever increasing requirements with respect to overlay, requirements of thermal stability of substrates to be exposed are also increasing. Further, when larger substrates such as 450 mm substrates are to be used, this may further tighten the thermal stability requirements.

In accordance with an embodiment of the present invention, which is explained in more detail below, it is proposed to shorten the path that is travelled by a thermally conditioned substrate from a thermal conditioning unit to the substrate table. This is realized in an embodiment of the present invention by providing that the substrate table and the thermal conditioning unit are inside the same compartment of the lithographic apparatus, at least during the transfer of the thermally conditioned substrate to the substrate table. In an embodiment, the thermal conditioning unit (TCU) and the substrate table are configured to be positioned adjacent each other during the transfer. In such embodiment, the TCU can e.g. be arranged such that the substrate table can be positioned below the TCU, enabling a rapid transfer of the conditioned substrate to the substrate table.

The depicted apparatus could be used in at least one of the following modes:

1. In step mode, the support structure (e.g. mask table) MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the support structure (e.g. mask table) MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the support structure (e.g. mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
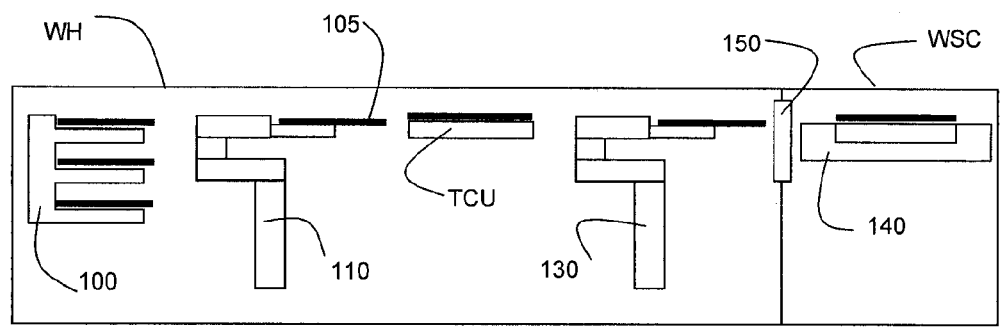
FIG. 2 depicts a typical lay-out of a part of a lithographic apparatus and an interface for transporting substrates according to an embodiment of the invention.

In FIG. 2, a typical lay-out of part of a lithographic apparatus and an interface for transporting substrates (also referred to as wafers) to and from the lithographic apparatus is schematically depicted.

In FIG. 2, an interface for transferring substrates is referred to as a wafer handler WH comprising a storage area 100, e.g. containing a cassette (or other type of storage means) for storing wafers. The wafer handler WH further comprises a robot 110 for transporting a wafer 105 from the cassette to a thermal conditioning unit (TCU) arranged to condition the wafer. Subsequently, the thermally conditioned wafer is transported by a further robot 130 to the wafer stage compartment WSC of the lithographic apparatus where the conditioned wafer can e.g. be positioned on the wafer stage 140. Typically, the transfer between the wafer handler WH and the lithographic apparatus, more specifically to the wafer stage compartment WSC, occurs via a so-called load lock or loading port 150 enabling to seal off the wafer stage compartment WSC from the wafer handler WH.

Figure 3:
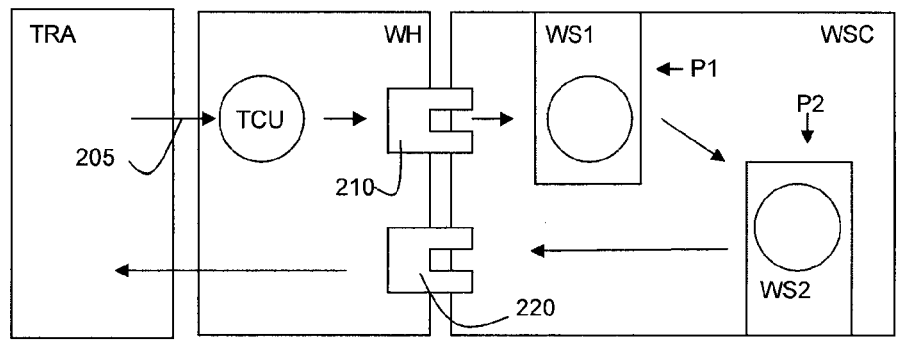
FIG. 3 depicts a top view of a typical lay-out of a part of a lithographic apparatus and an interface for transporting substrates according to an embodiment of the invention.

In FIG. 3, a top view is shown of a typical arrangement of the aforementioned components. In the arrangement, a wafer handler WH is schematically shown as an interface between a track apparatus TRA and the wafer stage compartment WSC of a lithographic apparatus. Wafers are transported from the track apparatus to the thermal conditioning unit (TCU) of the wafer handler WH as indicated by the arrow 205 (e.g. via a robot, not shown) where they are thermally conditioned. When conditioned, the wafer can be transported by a robot 210 (e.g. via a load lock or loading port, not shown) to a wafer stage WS1 arranged inside the wafer stage compartment WSC of the lithographic apparatus. Inside the lithographic apparatus, the wafer as provided on the wafer stage can be processed. Such processing can e.g. include performing measurements on the wafer (e.g. including determining a height map of the wafer surface or performing an accurate alignment using markers on the substrate) and performing exposures (e.g. using a patterned radiation beam) on the wafer. Typically, the measurements and exposures are performed on different, often adjacent, locations (indicated by the measure position P1 and the expose position P2) inside the wafer stage compartment. Typically, during measurement of a first substrate positioned on wafer stage WS1 (in a position P1), another substrate is being exposed on a second wafer table WS2 (in a second position P2). When the substrate on WS2 has been exposed, a further robot 220 of the wafer handler WH can remove the exposed wafer from the wafer stage compartment WSC for further processing in e.g. a track apparatus; the wafer stage WS1 can then be moved to the second position for exposure.

A drawback of the arrangements as schematically shown in FIGS. 2 and 3 is that it is difficult to maintain the desired thermal characteristics of the wafer during the transfer from the TCU provided in the wafer handler to the wafer stage. As a result, a temperature offset (compared to a desired value) or a non-uniformity with respect to temperature may have occurred when the conditioned wafer arrives on the wafer table of the wafer stage and needs to be processed, i.e. exposed. Such a deviation for a desired temperature profile may, as will be acknowledged by the skilled person adversely affect the proper exposure of the wafer resulting in unwanted overlay errors between consecutive layers provided on the wafer.

In order to mitigate such effect, it has been proposed to ensure that the transfer process from a TCU in an interface such as a wafer handler WH to a substrate table inside a wafer stage compartment WSC is reproduced as much as possible. By doing so, deviations in the thermal profile could be predicted and accounted for. Such an approach might have a negative impact on the operation of the interface as a buffer since such an approach requires tight timing requirements between the thermal conditioning unit and the wafer table.

In accordance with an embodiment of the present invention, a different position of the thermal conditioning unit is proposed, compared to the prior art arrangements as shown in FIGS. 2 and 3. In accordance with an embodiment of the present invention, it is proposed to provide that the thermal conditioning unit is arranged inside the lithographic apparatus, more specifically inside the same compartment where the substrate (or wafer) table is positioned, when the thermally conditioned substrate is transferred from the thermal conditioning unit to the substrate table. In order to produce ICs that are substantially defect-free, an accurate conditioning of the atmosphere surrounding the substrate to be exposed is required. As such, the exposure of a substrate in general takes place in a compartment of the apparatus that is accurately conditioned both with respect to temperature and particle contamination. Further conditioning by using particular types of gases can be considered as well. As such, in a lithographic apparatus, a wafer stage compartment (see e.g. the compartment WSC as indicated in FIG. 1) containing one or more wafer or substrate stages and a lower part of the projection system can, in general, be identified. In such a compartment, a position measurement system such as an interferometer system or an encoder based measurement system is in general applied as well. A similar arrangement may equally be found with respect to the patterning device. In order to ensure that the conditioned atmosphere inside such a compartment remains stable, access to such a compartment is often arranged via loading ports or so-called load locks which can be opened and closed to enable substrates to be transferred to and from the compartment. By providing that the thermal conditioning unit is arranged inside the compartment containing the substrate stage during the transfer, a thermally conditioned substrate can be transferred to a substrate table more rapidly compared to conventional arrangements whereby the conditioned substrate has to be transferred through a loading port or load lock. In the arrangement according to an embodiment of the invention, the path to be travelled by a thermally conditioned substrate from a thermal conditioning unit to the substrate table can be shortened substantially.

In an embodiment of the present invention, in order to mitigate the occurrence of a thermal drift of the wafer during the transfer, the thermal conditioning unit is integrated in the robot performing the transfer between the wafer handler and the wafer stage compartment of the lithographic apparatus. As such, the thermal conditioning can be performed until the substrate, that is to be handed over to the substrate table, is inside the wafer stage compartment.

Figure 4:
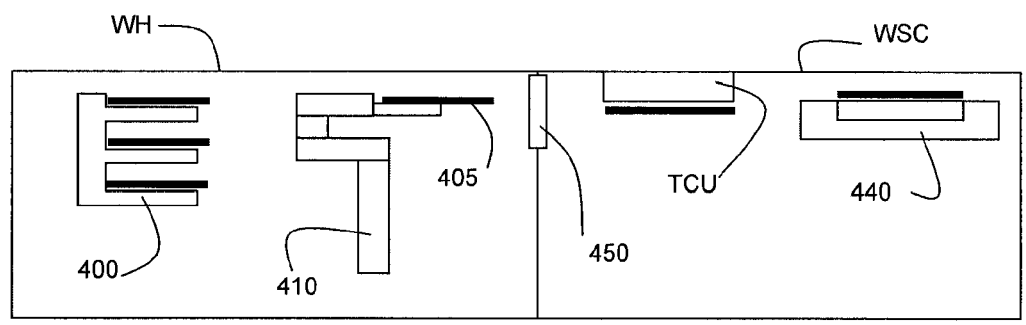
FIG. 4 depicts a lay-out of part of a lithographic apparatus according to the invention and an interface for transporting substrates according to an embodiment of the invention.

In FIG. 4, a schematic arrangement in accordance with another embodiment of the present invention is shown. In the arrangement as shown, the thermal conditioning unit is mounted inside the compartment comprising the substrate table, instead of being mounted to a robot performing the transfer between a wafer handler and a wafer stage compartment. In FIG. 4, an interface unit such as a substrate handler WH is schematically shown comprising a buffer unit 400 or storage area for e.g. storing substrates that have been processed by a track apparatus. The interface WH further comprises a robot 410 for transporting a substrate 405, via a loading port 450 to a thermal conditioning unit TCU. In the embodiment shown, the thermal conditioning unit TCU is arranged in a compartment WSC of apparatus that also contains a substrate table 440. In order to organize the hand-over of a thermally conditioned substrate from the thermal conditioning unit to the substrate table, various options exists that are explained in more detail below.

Figure 5:
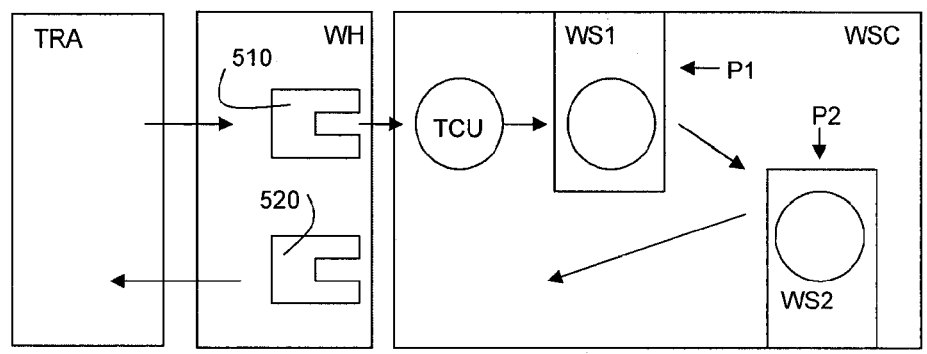
FIG. 5 depicts a top view of a part of a lithographic apparatus according to an embodiment of the invention and an interface for transporting substrates.

In FIG. 5, a top view of an arrangement in accordance with an embodiment of the present invention is schematically shown. In FIG. 5, an interface WH is schematically shown between a track apparatus TRA and the wafer stage compartment WSC of a lithographic apparatus. Inside the compartment WSC, a thermal conditioning unit (TCU) is provided which can be supplied with a substrate (e.g. via a robot such as the robot 510) that needs to be thermally conditioned. When conditioned, the wafer can be provided to a substrate table of a substrate stage WS1 arranged in the same compartment WSC of the lithographic apparatus for processing, e.g. performing measurements on the wafer (e.g. including determining a height map of the wafer surface or performing an accurate alignment) at a measurement position P1 and performing exposures (e.g. using a patterned radiation beam) at an expose position P2 inside the wafer stage compartment. Once a wafer has been exposed, a further robot 520 of the interface WH can remove the exposed wafer from the wafer stage compartment WSC for further processing in e.g. the track apparatus.

In an embodiment, the thermal conditioning unit and the substrate table that are arranged in the same compartment, are configured to be positioned adjacent each other during the transfer. By doing so, the handling of the thermally conditioned substrate can further be reduced. As an example, the thermal conditioning unit can be configured to hold the substrate (e.g. via a holder) below a lower surface of the unit while the substrate table is configured to be moved underneath the thermal conditioning unit for receiving the conditioned substrate. Similar holders are e.g. described in U.S. Pat. No. 7,106,420 for providing a buffering area inside a lithographic apparatus. As an alternative, the thermal conditioning unit and the substrate table can be positioned next to each other for transferring the substrate, e.g. by a robot that is arranged inside the compartment.

In an embodiment, the thermal conditioning unit can further include an alignment unit to perform a coarse alignment of the substrate, before, during or after the thermal conditioning. Such coarse alignment can e.g. include detection of the position of an edge feature such as a notch of the wafer.

Figure 6:
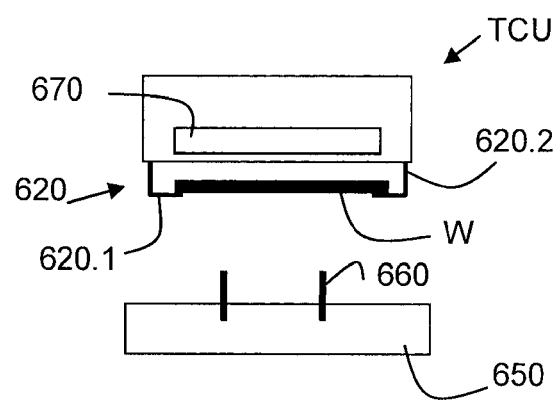
FIG. 6 depicts a thermal conditioning unit as can be applied in a lithographic apparatus according to an embodiment the invention.

In FIG. 6, a thermal conditioning unit (TCU) as can be applied in the lithographic apparatus according to an embodiment of the invention is schematically shown. The thermal conditioning unit TCU as shown is arranged to hold a substrate W that is to be conditioned, using a holder 620, indicated by brackets 620.1 and 620.2. In an embodiment, the holder or holding mechanism can comprise a plurality of brackets 620.1, 620.2 arranged to support the substrate along the edge of the substrate. In such embodiment, the brackets can be arranged to move outwardly and inwardly to retrieve and release the substrate. In order to allow such displacement, the holder can be provided with one or more actuators such as piezo-electric or electromagnetic actuators. In accordance with the invention, other types of holders such as (pre-loaded) air bearings could be considered to hold and/or position the substrate as well.

In an embodiment, the holder can further be arranged to rotate the substrate about an axis substantially perpendicular to the plane of the substrate, in order to coarse align the substrate, e.g. by detecting a notch or the like on the edge of the substrate. In order to provide the coarse alignment, the thermal conditioning unit can be equipped with an alignment unit, e.g. comprising an optical or mechanical detector for detecting the edge of the substrate.

In an embodiment, the thermal conditioning unit (TCU) can, as shown in FIG. 6, be mounted inside the compartment comprising a substrate table 650 which can be positioned below a thermally conditioned substrate. In such case, a positioning device such as the positioning device PW as shown in FIG. 1, can be used to position the substrate table below the thermal conditioning unit. Once the substrate table 650 is vertically aligned with the substrate W, the holder 620 may release the substrate such that it is received by the substrate table 650. In an embodiment, the substrate table 650 can be equipped with a support mechanism or support 660 (e.g. comprising a plurality of displaceable support pins) for supporting the substrate prior to the release of the substrate by the holder.

In order to thermally condition the substrate, the thermal conditioning unit TCU can be equipped with a cooling plate 670, which can e.g. be a metal structure provided with channels through which a fluid can flow. Using the holder 620, the substrate W can be brought into close proximity of the cooling plate which can e.g. form a lower surface of the thermal conditioning unit, in order to achieve a heat transport between the substrate W and the thermal conditioning unit TCU, in order to thermally condition the substrate. A benefit of the arrangement as shown in FIG. 6, whereby the thermal conditioning unit TCU is arranged to receive the substrate adjacent a bottom surface instead of mounting the substrate on a top surface of the thermal conditioning unit, is that the hand-over from the thermal conditioning unit to the substrate table does not require a complex, often bulky robot for transporting the conditioned substrate to the substrate table. Further, as shown, use can be made of a support 660 of the substrate table for facilitating the transfer.

It is further worth mentioning that the application of the thermal conditioning unit inside the same compartment of the lithographic apparatus as the substrate table, may simplify the design of the interface (such as the interface WH shown above) between the lithographic apparatus and a further apparatus such as a track due to the reduced number of handlings to be performed with the substrate inside the interface. A further simplification of the interface unit can be achieved when, as described above, the functionality of a coarse alignment of the substrate (also know as pre-alignment) is incorporated in the thermal conditioning unit. Various embodiments of the lithographic apparatus according to the invention may further enable an increase in throughput of the lithographic apparatus, because they enable a more rapid take over of the substrate.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
   a patterning device support configured to support a patterning device, the patterning device configured to pattern a radiation beam to form a patterned beam of radiation;
   a substrate table constructed to hold a substrate;
   a projection system configured to project the patterned beam of radiation onto the substrate;
   a compartment configured to receive the substrate table, wherein the patterning device support is arranged outside the compartment;
   a thermal conditioning unit arranged to
     receive a substrate to be exposed, and
     thermally condition the substrate; and
   a transfer system configured to transfer a thermally conditioned substrate to the substrate table, wherein the substrate table and the thermal conditioning unit are arranged inside the compartment of the lithographic apparatus during a transfer of the thermally conditioned substrate from the thermal conditioning unit to the substrate table,
   wherein the transfer system comprises a holder mounted to the thermal conditioning unit and configured to hold the substrate, and
   wherein the holder is arranged to hold the substrate underneath a cooling plate of the thermal conditioning unit.

2. The lithographic apparatus according to claim 1, wherein the thermal conditioning unit is mounted inside the compartment.

3. The lithographic apparatus according to claim 1, wherein the thermal conditioning unit and the substrate table are configured to be positioned adjacent to each other during the transfer.

4. The lithographic apparatus according to claim 1, wherein the holder is arranged to rotate the substrate about a vertical axis for coarse alignment of the substrate.

5. The lithographic apparatus according to claim 1, wherein the holder is arranged to hold the substrate near the cooling plate to enable a heat exchange between the substrate and the cooling plate.

6. The lithographic apparatus according to claim 1, wherein the holder is arranged to release the substrate when the substrate table is arranged below the thermal conditioning unit and a support of the substrate table is supporting the substrate.

7. The lithographic apparatus according to claim 1, wherein the transfer system comprises a gripper configured to displace the thermally conditioned substrate from the thermal conditioning unit to the substrate table, when the thermal conditioning unit is adjacent to the substrate table.

8. The lithographic apparatus according to claim 1, wherein the thermal conditioning unit is arranged near a loading port of the compartment so that the conditioning unit is adapted to receive the substrate via the loading port from a robot arranged outside of the compartment.

9. The lithographic apparatus according to claim 1, wherein the thermal conditioning unit comprises an alignment unit configured to perform a coarse alignment of the substrate.

10. A device manufacturing method comprising:
    receiving a substrate to be exposed by a thermal conditioning unit arranged in a lithographic apparatus;
    thermally conditioning the substrate;
    transferring the thermally conditioned substrate to a substrate table provided in a compartment of the lithographic apparatus, the substrate table and the thermal conditioning unit being arranged inside the compartment of the apparatus during the transfer;
    patterning a beam of radiation with a patterning device arranged on a patterning device support, and
    projecting the patterned beam of radiation onto the substrate with a projection system,
    wherein the patterning device support is arranged outside the compartment,
    wherein thermally conditioning the substrate comprises holding the substrate to be exposed underneath a cooling plate of the thermal conditioning unit to enable a heat exchange between the substrate and the cooling plate.

11. The device manufacturing method according to claim 10, wherein the transferring comprises positioning the thermal conditioning unit adjacent the substrate table.

12. The device manufacturing method according to claim 10, comprising performing a coarse alignment of the substrate by an alignment unit mounted to the thermal conditioning unit.

13. The lithographic apparatus according to claim 1, comprising a load lock arranged in a partition of the compartment and through which, in use, the substrate is transferred from a wafer handler to an interior volume of the compartment, said load lock enabling to seal off the compartment from the wafer handler.

14. The device manufacturing method according to claim 10, wherein a load lock is arranged in a partition of the compartment and through which, in use, the substrate is transferred from a wafer handler to an interior volume of the compartment, said load lock enabling to seal off the compartment from the wafer handler.

15. The lithographic apparatus according to claim 1, wherein at least part of the projection system is arranged outside the compartment.

16. The device manufacturing method according to claim 10, wherein at least part of the projection system is arranged outside the compartment.

* * * * *